(12) United States Patent
Hoheisel

(10) Patent No.: US 11,709,383 B2
(45) Date of Patent: Jul. 25, 2023

(54) OPTICAL COMMUNICATION AND POWER GENERATION DEVICE AND METHOD

(71) Applicant: Raymond Hoheisel, Arlington, VA (US)

(72) Inventor: Raymond Hoheisel, Arlington, VA (US)

(*) Notice: Subject to any disclaimer, the term of this patent is extended or adjusted under 35 U.S.C. 154(b) by 888 days.

(21) Appl. No.: 16/438,393

(22) Filed: Jun. 11, 2019

(65) Prior Publication Data

US 2019/0377202 A1 Dec. 12, 2019

Related U.S. Application Data

(60) Provisional application No. 62/683,861, filed on Jun. 12, 2018.

(51) Int. Cl.
| | |
|---|---|
| *G02F 1/017* | (2006.01) |
| *H01L 31/02* | (2006.01) |
| *H01L 31/054* | (2014.01) |
| *G02F 1/01* | (2006.01) |

(52) U.S. Cl.
CPC ............ *G02F 1/017* (2013.01); *G02F 1/0121* (2013.01); *H01L 31/02008* (2013.01); *H01L 31/0547* (2014.12); *G02F 2201/34* (2013.01)

(58) Field of Classification Search
None
See application file for complete search history.

(56) References Cited

U.S. PATENT DOCUMENTS

| 4,963,949 A | 10/1990 | Wanlass et al. |
|---|---|---|
| 5,019,177 A | 5/1991 | Wanlass |
| 6,154,299 A | 11/2000 | Gilbreath et al. |
| 7,095,050 B2 | 8/2006 | Wanlass et al. |
| 7,719,746 B2 | 5/2010 | Goetz et al. |
| 8,379,286 B2 | 2/2013 | Klotzkin et al. |
| 2009/0168459 A1 | 7/2009 | Holman et al. |
| 2009/0232509 A1 | 9/2009 | Heikenfeld et al. |

(Continued)

FOREIGN PATENT DOCUMENTS

| CA | 2766686 A1 * 12/2010 ......... H01L 31/0232 |
|---|---|
| CN | 105939148 A 9/2016 |

(Continued)

OTHER PUBLICATIONS

A. Carrasco-Casado et al, "Optical Communication on CubeSats—Enabling the Next Era in Space Science," Proc. of IEEE International Conference on Space Optical Systems and Applications, 2017, pp. 1-7.

(Continued)

*Primary Examiner* — Christopher Stanford
*Assistant Examiner* — Journey F Sumlar
(74) *Attorney, Agent, or Firm* — Banner & Witcoff, Ltd.

(57) ABSTRACT

An integrated device comprising at least one photovoltaic element, at least one light modulating element, at least one light reflecting element and one or more electrical conductors coupled to the photovoltaic element and the light modulating element. An interrogating light beam can be pointed at the integrated device, and a modulated light beam is reflected back by the device in the direction of the interrogating light beam with the reflected light beam containing information/data being modulated by the device onto the reflected light beam.

20 Claims, 12 Drawing Sheets

(56) References Cited

U.S. PATENT DOCUMENTS

| | | |
|---|---|---|
| 2011/0292485 A1 | 12/2011 | Klotzkin et al. |
| 2017/0062642 A1 | 3/2017 | Pantha et al. |

FOREIGN PATENT DOCUMENTS

| | | |
|---|---|---|
| DE | 202009018167 U1 | 5/2011 |
| WO | 9959271 A1 | 11/1999 |
| WO | 0233477 A2 | 4/2002 |
| WO | 2005086585 A2 | 9/2005 |
| WO | 2007036937 A2 | 4/2007 |
| WO | 2014009720 A1 | 1/2014 |
| WO | 2018039558 A1 | 3/2018 |

OTHER PUBLICATIONS

P. Goetz, et al, "Modulating Retro-reflector Lasercom System at the Naval Research Laboratory", The 2010 Military Communications Conference, 2010. DOI: 10.1109/MILCOM.2010.5680205, pp. 1-7.

B. A. Warneke, et al., "An autonomous 16 mm3 solar-powered node for distributed wireless sensor networks," Sensors, 2002 IEEE, Orlando, FL, USA, 2002, pp. 1510-1515 vol. 2. doi: 10.1109/ICSENS.2002.1037346.

L. Zhou, et al, "Corner-cube retroreflectors based on structure-assisted assembly for free-space optical communication," in Journal of Microelectromechanical Systems, vol. 12, No. 3, pp. 233-242, Jun. 2003. doi: 10.1109/JMEMS.2003.809956.

Sep. 25, 2019—(WO) International Search Report and Written Opinion—App PCT/US2019/036707.

The Open Mind Staff Contributor "Transparent Solar Panels Will Turn Windows Into Green Energy Collectors" The Open Mind, https://www.the-open-mind.com/transparent-solar-panels-will-turn-windows-into-green-energy-collectors/, Feb. 19, 2019 pp. 1-9.

Harald Haas "Forget Wi-Fi. Meet the new Li-Fi Internet" Youtube, Ted Talk, https://www.youtube.com/watch?v=iHWIZsIBj3Q published Dec. 2, 2015, pp. 1-3.

Harald Haas "Wireless data from every light bulb" TED Talk, https://www.ted.com/talks/harald_haas_wireless_data_from_every_light_bulb, website visited Jul. 9, 2019, pp. 1-4.

Qusi Alqarqaz "Li-Fi: 100 Times Faster Than Wi-Fi" IEEE Spectrum website: https://spectrum.ieee.org/news-from-around-ieee/the-institute/ieee-member-news/lifi-100-times-faster-than-wifi Aug. 31, 2016, pp. 1-2.

\* cited by examiner

OPTICAL COMMUNICATION AND POWER GENERATION DEVICE AND METHOD

CROSS-REFERENCE TO RELATED APPLICATIONS

This application is a non-provisional of and claims priority to provisional U.S. Patent Application No. 62/683,861, filed on Jun. 12, 2018, and entitled "Optical Communication and Power Generation Device and Method" herein incorporated by reference in its entirety.

FIELD OF THE TECHNOLOGY

Aspects described herein are generally related to the fields of optical communication and optical energy conversion. More specifically, aspects described herein provide a thin film communication and power generation device using a photovoltaic element, a retroreflector element, and an optical modulator element.

BACKGROUND

Autonomously operating systems are used in many fields of the modern economy. Their usage usually comprises the collection of environmental data, and subsequent data processing and aggregation, as well as data communication to and from a data transmitting, receiving and control system. To power autonomously operating systems, a reliable and standalone energy source is needed, such as solar power, batteries or similar. Radio frequency (RF) based systems are often used for communication to and between autonomous systems due to their simplicity of integration. However, radio frequency systems can be limited due to their short range of operation, high power requirements, signal interference, limited beam steering capabilities, and health risks. In particular, for military operations which require large standoff distances, radio frequency communication links are susceptible to detectability, spamming or spoofing. Optical communication systems, on the other hand, allow for high data rates and are less susceptible to signal interference. However, optical communication systems often require precise pointing control of both receiver and sender unit and often require large, heavy, and expensive optics. Therefore, the integration of optical communication systems can be complicated in a variety of autonomous and unmanned sensor, communication and transport systems, including but not limited to satellites, ground vehicles, unpiloted air vehicles, as well as consumer products.

SUMMARY

The following summary presents a simplified summary of certain features. The summary is not an extensive overview and is not intended to identify key or critical elements.

Aspects described herein provide a solution that allows both the generation of electrical energy and optical communication in one integrated device which is lightweight, mechanically flexible, and scalable for various energy generation and optical free-space (FSO) communication needs.

Aspects described herein may include a photovoltaic element, a retroreflector element, an optical modulator element, electrical contacts, and electrical conductors. An interrogating light beam can be pointed at the device, and a modulated light beam is reflected back by the device in the direction substantially parallel to the interrogating light beam with the reflected light beam containing information/data being modulated by the device onto the reflected light beam.

Described herein is an integrated optical communication and electrical energy generation device with at least one photovoltaic element, at least one light modulating element, a one or more first electrical contacts and/or conductors coupled to the at least one light modulating element, and at least one light reflecting element. The integrated optical communication and electrical energy generation device may also comprise one or more second electrical contacts and/or conductors coupled to the photovoltaic element. In some embodiments, power harvesting and storage circuitry may be connected to said second electrical contacts and/or conductors to convert and store the electrical energy generated by the photovoltaic element. A signal generating circuitry, which may be powered by the power harvesting and storage circuitry, may generate the electric signals for the light modulating element.

In some embodiments, the photovoltaic element may be adjacent to the light reflecting element. The photovoltaic element may receive a first light beam from a first direction, and may generate electrical energy from at least a portion of energy associated with the first light beam. The light modulating element may receive a second light beam from a second direction, and may modulate the second light beam in response to electric signals from the one or more first electrical contacts and/or conductors. The light reflecting element may redirect a substantial portion of the modulated second light beam in a third direction parallel to the second direction.

In some embodiments, the photovoltaic element may be adjacent to the light modulating element. The photovoltaic element may receive a first light beam from a first direction, and convert at least a portion of energy associated with the first light beam into electrical energy. The light modulating element may modulate a second light beam from a second direction in response to electric signals from the one or more first electrical contacts and/or conductors. The light reflecting element may redirect a substantial portion of the modulated second light beam in a third direction parallel to the second direction. In some embodiments, one or more first doped semiconducting elements may be disposed between the at least one modulator element and the light reflecting element, and one more second doped semiconducting elements may be disposed between the at least one light modulator element and the photovoltaic element.

In some embodiments, the integrated optical communication and electrical energy generation device may further comprise a transparent element or a display adjacent to the photovoltaic element.

Some embodiments of the integrated optical communication and electrical energy generation device may comprise a first light reflecting element and a second light reflecting element. The first light reflecting element may have a first internal surface adjacent to the photovoltaic element and a first external textured surface. The first light reflecting element may receive a first light beam from a first direction through the first external textured surface. The second light reflecting element may have a second internal surface adjacent to the light modulating element and a second external textured surface. The second light reflecting element may receive a second light beam from a second direction through the second external textured surface. The photovoltaic element may receive a third light beam from a third direction. The photovoltaic element may convert at least a portion of energy associated with the third light beam into electrical energy. The light modulating element may modulate at least one of the first light beam and the second light beam in response to electric signals from the one or more first conductors. The first light reflecting element may redirect a substantial portion of the second light beam in a fourth direction parallel to the second direction, and the second light reflecting element redirects a substantial portion of the first light beam in a fifth direction substantially parallel to the first direction.

Some embodiments of the integrated optical communication and electrical energy generation device may comprise a plurality of light modulating elements separated by one or more insulating layers and coupled to the one or more first conductors. The plurality of light modulating elements may comprise a first light modulating element adjacent to the photovoltaic element and a second light modulating element adjacent to the light reflecting element. The photovoltaic element receives a first light beam from a first direction, and converts at least a portion of energy associated with the first light beam into electrical energy. Each of the light modulating elements, from the plurality of light modulating elements, may modulate one or more second light beams within a light wavelength range specific to said light modulating element in response to electric signals from the one or more first conductors. The light reflecting element redirects a substantial portion of the modulated one or more second light beams in one or more third directions substantially parallel to the one or more second directions.

Some embodiments of the integrated optical communication and electrical energy generation device may comprise a plurality of photovoltaic elements and a plurality of light modulating elements disposed over the light reflecting element. An element from the plurality of photovoltaic elements and the plurality of light modulating elements receives a first light beam from a first direction. Each light modulating element from the plurality of light modulating elements, modulates the first light beam, within a light wavelength range specific to said light modulating element in response to electric signals from the one or more first conductors. Each photovoltaic element from the plurality of photovoltaic elements, converts at least a portion of energy associated with a second light beam from a second direction into electrical energy. The light reflecting element redirects a substantial portion of the modulated first light beam in a third direction parallel to the first direction.

Some embodiments of the integrated optical communication and electrical energy generation device may comprise a light reflecting substrate, a plurality of light modulating elements disposed over the light reflecting substrate, one or more first conductors coupled to the plurality of light modulating elements, a plurality of photovoltaic elements disposed over the plurality of light modulating elements, and one or more second conductors coupled to the plurality of photovoltaic elements.

Some embodiments of the integrated optical communication and electrical energy generation device may comprise temperature stabilizing circuitry, which may be powered by the power harvesting and storage circuitry, wherein the temperature stabilizing circuitry maintains an operating temperature of the integrated device.

Applications include but are not limited to systems which require an autonomous electrical energy supply as well as a data communication interface and link, such as satellites, unmanned airplanes, ground, marine and underwater vehicles, friend-or-foe detection devices, identification tags for consumer products and shipping containers; handheld mobile devices capable of optical communication; as well as road traffic signs.

Some advantages of the integrated optical communication and electrical energy generation device include: (a) self-powered, autonomous operation using ambient light including but not limited to the sun, or directed light sources such as lasers, (b) high data rates for optical communication, (c) suitability for short-range, medium-range and long-range communication links ranging from less than 1 m to more than 100 km, (d) suitability for multi-user/link operation, (e) lightweight and mechanically flexible/bendable structure with a thickness of less than 1 mm, and (f) scalability of the surface area of the device over several orders of magnitude from less than 1 square mm to more than 1 square m.

Other advantages comprise a design of the integrated optical communication and electrical energy generation device that is transparent at wavelengths visible to the human eye.

Some aspects, e.g., may be used to create an identification tag that cannot be spammed by radio frequency based systems. Some embodiments are particularly useful for space applications. For example, satellite attitude control requirements can be largely reduced, which complicated the integration of FSO links into smaller satellites in the past. The combined optical communication and power generation device can be integrated into existing satellite solar arrays at virtually no additional weight and no additional surface area requirements. The combined optical communication and power generation device can replace and/or complement otherwise power consuming and heavy RF communication equipment and overcome already challenging RF bandwidth limitations, in particular for large CubeSat constellations. The combined optical communication and power generation device can also enable FSO communications between Earth and a lunar lander or a deep space platform.

Furthermore, the "Internet of Things" movement has produced an increasing number of autonomously operating sensor and data transmission systems which leads to an increasing number of autonomously operating sensor and data transmission systems for which energy efficient operation, secure communication, and high data transmission rates are crucial. This trend is supported by autonomously operated vehicles and their increasing need for secure, high-speed data exchange for which optical data links can be attractive in dense traffic conditions. The combined optical communication and power generation device can add a power and data exchange capability to such an autonomously operating sensor and data transmission systems.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Example and illustrative methods and systems are described herein. Any illustrative embodiment or feature described herein is not necessarily to be construed as preferred or advantageous over other embodiments or features. The illustrative embodiments and aspects described herein are not meant to be limiting. It will be readily understood that certain aspects of the disclosed systems and methods can be arranged and combined in a wide variety of different configurations, all of which are contemplated herein.

Furthermore, the particular arrangements shown in the Figures should not be viewed as limiting. It should be understood that other embodiments and/or aspects may include more or less of each element shown in a given Figure. Further, some of the illustrated elements may be combined, split into multiple components/steps, or omitted. Yet further, one or more illustrative embodiments may include elements that are not explicitly illustrated in the Figures.

Aspects described herein contribute to an apparatus, method of manufacturing, and system for an integrated optical communication and electrical energy generation device. The apparatus or system may be used in diverse commercial, consumer, defense, aerospace, environmental, road safety, transportation, and telecommunication related applications. Aspects and features described in the following combine the electrical energy generation capability of a photovoltaic device with the optical data communication capability of an electrically modulated retroreflector in one device.

Figure 1A:
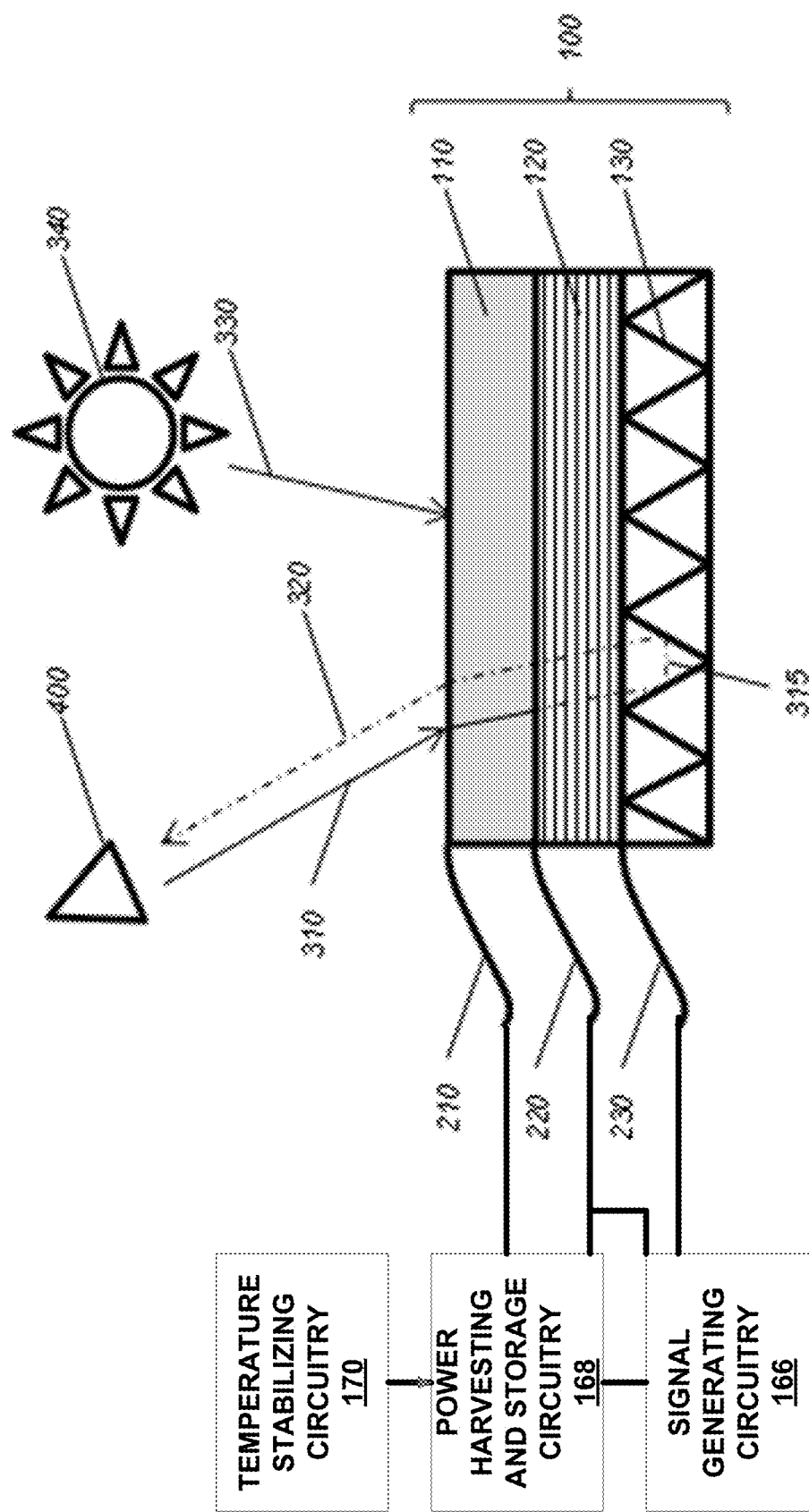
FIG. 1A illustrates a cross-sectional view of a first embodiment of an integrated optical communication and electrical energy generation device comprising a photovoltaic element, an optical modulator element, a retroreflector element, and electrical contacts.

FIG. 1A shows an illustrative embodiment of the integrated optical communication and electrical energy generation device 100. The device may include a photovoltaic element 110 for light to electrical energy conversion, an electrically controlled light modulator element 120 which is able to change its transparency for light of a defined wavelength range as a function of an externally applied electrical signal, a retroreflector element 130, such as a cat-eye reflector or a corner cube reflector, which is able to reflect the modulated light 320 back in the direction of the incoming light beam 310.

The photovoltaic element 110 may absorb incoming light 330, such as light from the sun 340, ambient room light or otherwise suited light sources and convert the incoming light to electrical energy which can be made available to a power harvesting and storage circuitry 168 through electrical contacts and/or conductors 210 and 220. The photovoltaic element may consist of a planar semiconductor p-n diode made of Silicon, GaAs, InGaAs or other semiconductors, such as III-V semiconductors like GaInP, InP, AlGaAs or similar, or other materials suited for photovoltaic energy conversion, like CdTe, CIGS, or similar. The photovoltaic element 110 may absorb a portion of the incoming light within a certain wavelength range as defined by the photovoltaic element's bandgap energy or light absorption characteristics. The photovoltaic element 110 may be transparent in a certain wavelength range or semi-transparent in a certain wavelength range, such that incoming light of a certain wavelength range can reach the optical modulator 120. For example, the photovoltaic element may not include any metal backing, and may be constructed on a transparent wafer or handling substrate which may be polished on one or both sides.

The optical modulator 120 may change its transparency for light of a certain wavelength range as a function of an electrical signal which can be applied through electrical contacts and/or conductors 220 and 230 by the signal generating circuitry 166. The signal generating circuitry 166 may be powered by the power harvesting and storage circuitry 168. Incoming light 310 of a certain wavelength range and incident angle can pass through the photovoltaic element 110 towards the optical modulator 120 where depending on the externally applied electrical signal, the modulator can impose a digital or analog or otherwise suited modulation onto the light, including but not limited to states of the modulator during which the modulator is transparent, semi-transparent or opaque or during which the modulator affects, changes, modulates, transmits, or absorbs light of a defined polarization. The modulation allows encoding information/data onto the incoming light 310. The optical modulator may comprise one or a multitude of the following elements, including but not limited to a liquid crystal modulator, an acousto-optic modulator, a Fabry-Perot based modulator, a multi-quantum well (MQW) based modulator, a distributed Bragg-reflection modulator, an optically tunable filter modulator, a polarization modulator, or similar. Modulation frequencies may be in the range of 10 Hz or less to 1 GHz or more.

A retroreflector element 130 reflects the modulated light 315 back in the direction 320 substantially parallel to the direction of the incoming light 310. The retroreflector may consist of a corner cube reflector, a spherical reflector, a phase-conjugate mirror, moth-eye like gratings, gratings, dispensed spheres, etched structures, holographic structures or otherwise suited mirror or reflector materials including but not limited to commercially available reflective tape such as 3M flexible prismatic reflective sheeting, or a combination thereof. A corner cube reflector may be fabricated by use of a Nickel shim from a master polymer via two-photon absorption for sharp corners and defined angles. The retroreflector element 130 may also be designed to reflect the modulated light 315 back in a desired direction which is not parallel to the direction of the incoming light 310.

Once the reflected and modulated light 320 exits the integrated optical communication and electrical energy generation device, it contains data/information which can be detected and recorded by a communication and control system 400. Control system 400 may comprise a telescope and/or a photodiode.

The integrated optical communication and electrical energy generation device 100 may have a height of less than 200 µm. Due to its relatively thin thickness, the integrated optical communication and electrical energy generation device 100 may be mechanically flexible and may be attached to certain objects like a regular sticker. The device and elements of the integrated optical communication and electrical energy generation device 100 can be manufactured by epitaxial growth, epitaxial lift-off, bonding, transfer printing, mechanical stacking, gluing, similar methods, or a combination of said methods. A device 100 that is manufactured using epitaxial processes may be comprised of a single or double-sided polished (DSP) wafer or a substrate made of GaAs, InP, Si, Ge or similar to achieve desired properties of optical reflection, diffraction, transmission, surface smoothness, and device flatness.

The electrical energy generated by the photovoltaic element 110 may be used to power and control the optical modulator 120 as well as the signal generating circuitry 166. This makes the integrated optical communication and electrical energy generation device 100 suitable for applications that require (a) standalone operation without an external electrical energy source, (b) long operational lifetime, (c) a high speed optical data communication interface, (d) data readout capability from a long standoff distance, as well as resilience against radio frequency spamming or spoofing.

The wavelength range of the incoming light 310 to be modulated by device 100 may be in the range of 500 nm or less to 2500 nm or more, whereas the wavelength may be chosen to be larger than the respective wavelength of the bandgap energy of the photovoltaic element 110 to minimize absorption losses within device 100. In an exemplary embodiment of device 100 with a photovoltaic element 110 comprised of GaAs having a bandgap energy at room temperature corresponding to the absorption of photons with a wavelength of less than approximately 900 nm a suitable operating wavelength range of the modulator element 120 may be within 950 nm or less and 1100 nm or more including wavelengths of up to approximately 1550 nm to best couple to commercially available laser systems. Multi-quantum-well modulators operating in such a wavelength range can be fabricated via epitaxial growth including but not limited to the usage of III-V semiconductors such as InGaAs, InGaAsP, InP, InAsP, AlGaAs, InAlGaAs, GaAsP, or similar. The applied electrical signal to the electrical contacts of the modulator 220 and 230 may be a voltage of less than 5V or a voltage of more than 15V.

Standard solar cells often have a metalized electrically conductive rear side which absorbs light and which generally yields very low optical transmission properties. The photovoltaic element 110 for usage in device 100 may be comprised of an electrically conductive rear side which may be located at the interface between photovoltaic element 110 and modulator 120, and which may be optically transparent in a defined wavelength range. Said electrically conductive rear side of the photovoltaic element 110 may contain or may be made of a highly doped semiconductor lateral conduction layer, an Indium-Tin-Oxide (ITO) layer, a fluorine doped tin oxide (FTO) layer, a carbon nanotube network layer, a graphene layer, a doped zinc oxide layer, a combination of such layers, or an otherwise suited optically transparent and electrically conductive layer. The electrically conductive rear side of photovoltaic element 110 may be electrically connected to the electrical contact 220. The electrical contact 220 may serve as a common ground for both the photovoltaic element 110 and the modulator 120 such that device 100 may be a three-terminal device. Metal interconnects, contacting schemes and technologies, as exemplarily described in U.S. Pat. No. 5,0190,177 for usage in an III-V semiconductor three-terminal device, may be used to as electrical contacts.

In another exemplary embodiment, the photovoltaic element 110 and the light modulating element 120 may have no common electrical contact or contacts. The photovoltaic element 110 and the light modulating element 120 may have individual electrical contacts and may be separated by an electrically insulating and for the modulated light optically transparent layer located between photovoltaic element 110 and the light modulating element 120 such that the device 100 may have four or more electrical terminals.

In another exemplary embodiment, the device 100 may have two electrical contacts, also referred to as a two terminal device, such that the photovoltaic element 110 and the light modulating element 120 may be electrically connected and said electrical connection may not be available as an external electrical contact.

If device 100 is operated in an environment in which large fluctuations of temperature occur, such as in space, the wavelength dependent absorption, transmission, polarization and modulation properties of the photovoltaic element 110, the light modulating element 120, and the light reflecting element 130 may change with temperature. This may be accounted for by a change of the emitting and/or receiving light wavelength and/or light polarization properties of the communication and control system 400. That is, the wavelength range of multi-quantum-well modulators may shift with temperature. Existing laser systems allow for the changing of the emitted wavelength and thus could be used to account for the potential change of the temperature dependent characteristics of multi-quantum-well modulators or other light modulating elements. Similarly, temperature-induced changes of the polarization properties of device 100 may be accounted for by changing the emitting and receiving light polarization properties of the communication and control system 400. The temperature of device 100 may also be stabilized by a heater or a cooler which may be controlled and powered fully or in part by electrical energy generated by the photovoltaic element 110 and stored in the power harvesting and storage circuitry 168.

The angle of incidence of the incoming light 310 may be within 0 degrees from normal to about 70 degrees or more from normal.

Multiple communication and control units 400 may be used simultaneously and/or sequentially from similar and/or different directions and incoming angles to read data from device 100.

The incoming light 310 may already be modulated. Said modulation of the incoming light may be by modulation of the light intensity, the light wavelength, the modulation frequency, the light polarization, or a combination of said modulation methods. A sensor, such as a photodiode or a filtered photodiode, can be attached to or be integrated into device 100 to measure and record this modulation. The modulated signal may comprise instructions for device 100, such as instructions on which information/data shall be modulated onto the light beam by device 100 prior to the light being reflected back to control unit 400. Said instructions may also contain information on the desired modulation data rate, method, duty cycle, electrical energy usage, or similar.

The photovoltaic element 110 may be operated in reverse, e.g., as a light emitting diode, to emit light with modulated data/information into a multitude of directions.

The order in which optically relevant elements and/or electrically relevant elements, such as electrical contacts, are stacked or arranged within device 100 may be changed in part or as a whole, including but not limited to the placement of the light modulating element 120 at the or near the surface of device 100 and/or on top of the photovoltaic element 110.

In some cases, the modulating frequency may be increased by segmenting the device 100 into smaller sub-devices which may be arranged in a mosaic or array pattern and which may be driven with the same or different modulation signals. A reduced area size often correlates with a reduced RC switching time and reduced power consumption. Segmentation may be achieved via localized etching, localized ion bombardment, transfer printing, cutting, or similar methods. Electrical contacts to the sub-devices may comprise wires, backside contacts, metal-wrap-through technology, or other contact technology that may be realized from the rear side of the device. Segmentation size and shape of the modulating element and the photovoltaic element may be similar or different. Only the modulating element may be segmented whereas the photovoltaic element may be unsegmented. Sub-devices may be smaller than 1 square mm or larger than 100 square mm.

Several devices 100 may also be arranged in pairs or in an array whereas the respective electrical contacts of each photovoltaic element 110 may be connected in parallel or series, individually connected or a combination thereof and whereas the electrical contacts of each optical modulator element 120 may be connected in parallel, series, individually or a combination thereof. In such a paired or array configuration of serval devices 100 the overall area suitable for light to electrical energy conversion via the photovoltaic element may be increased by the factor of the amount of paired devices 100 whereas the effective area determining the RC switching time of the light modulating element may remain unchanged which may be favorable for overall fast data rates and increased energy generation of device 100.

Figure 1B:
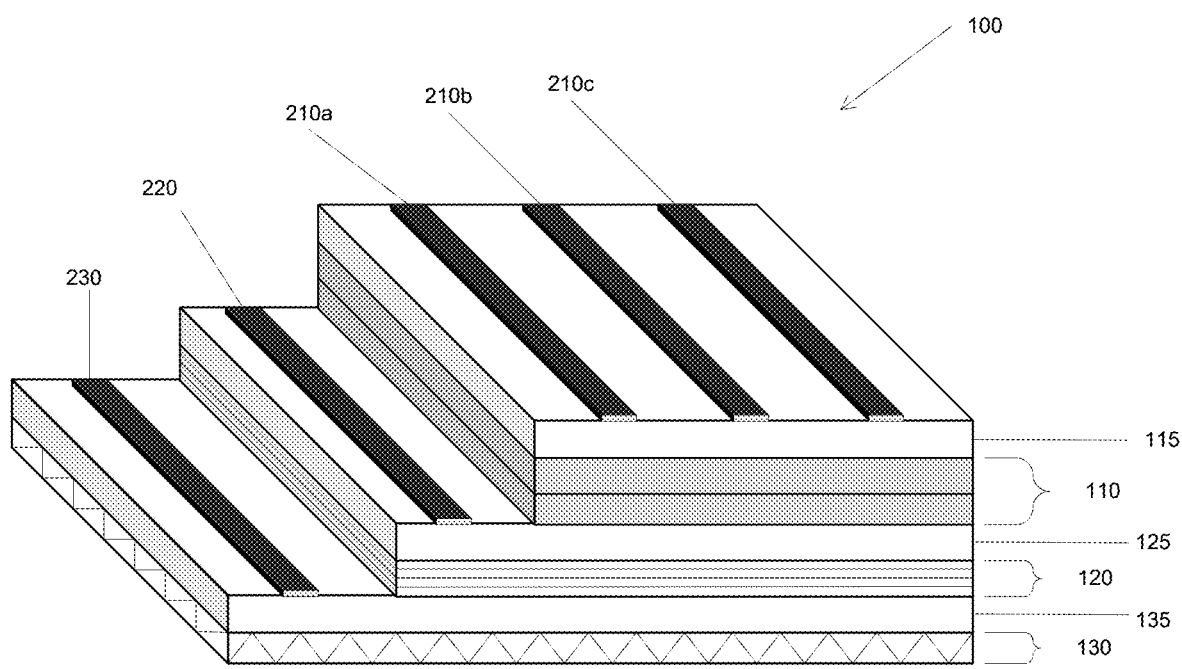
FIG. 1B illustrates a schematic view of the integrated optical communication and electrical energy generation device.

FIG. 1B illustrates a schematic view of the integrated optical communication and electrical energy generation device 100 in FIG. 1A. The device may include a photovoltaic element 110, an electrically controlled light modulator element 120, a retroreflector element 130 and electrical contacts and conductors, such as the conductive strips 210*a*, 210*b*, 210*c*, 220, and 230. The conductive strips 210*a*, 210*b*, 210*c*, 220, and 230, may be made of polysilicon, metal or other suitable conductive material, such as a plurality metal layers made of tungsten (W), titanium nitride (TiN), tantalum nitride (TaN) or the arbitrary combinations thereof.

The retroreflector element 130 may be separated from the conductive strip 230 by a first doped semiconducting element 135. Even though only one conductive strip is shown between the retroreflector element 130 and the first doped semiconducting element 135, multiple conducting strips may be disposed on top of the first doped semiconducting element 135. The electrically controlled light modulator element 120 is disposed on top of the first doped semiconducting element 135 and is electrically coupled to the conductive strip 230, and any other conductive strips disposed on top of the first doped semiconducting element 135. Electrical signals can be applied through the conductive strip 230, and any other conductive strips disposed on top of the doped semiconducting element 135 to the optical modulator element 120. A second doped semiconducting element 125 may be disposed on top of the electrically controlled light modulator element 120. A second plurality of conductive strips, such as the conductive strip 220, is disposed on top of the second doped semiconducting element 125. The second plurality of conductive strips, such as the conductive strip 220, may act as a ground contact for the integrated optical communication and electrical energy generation device 100. The photovoltaic element 110 is disposed on top of the second doped semiconducting element 125 and is electrically coupled to the conductive strip 220, and any other conductive strips disposed on top of the second doped semiconducting element 125. A third doped semiconducting element 115 may be disposed on top of the photovoltaic element 110. A third plurality of conductive strips, such as the conductive strips 210*a*, 210*b*, and 210*c*, is disposed on top of the third doped semiconducting element 115. Converted electrical energy from the photovoltaic element 110 can be made available through the third plurality of conductive strips, such as the conductive strips 210*a*, 210*b*, and 210*c*. The first doped semiconducting element 135, the second doped semiconducting element 125 and the third doped semiconducting element 115 may comprise high and/or low doped semiconductor layers or an otherwise suited optically transparent material such as glass or similar or a combination thereof.

Figure 2:
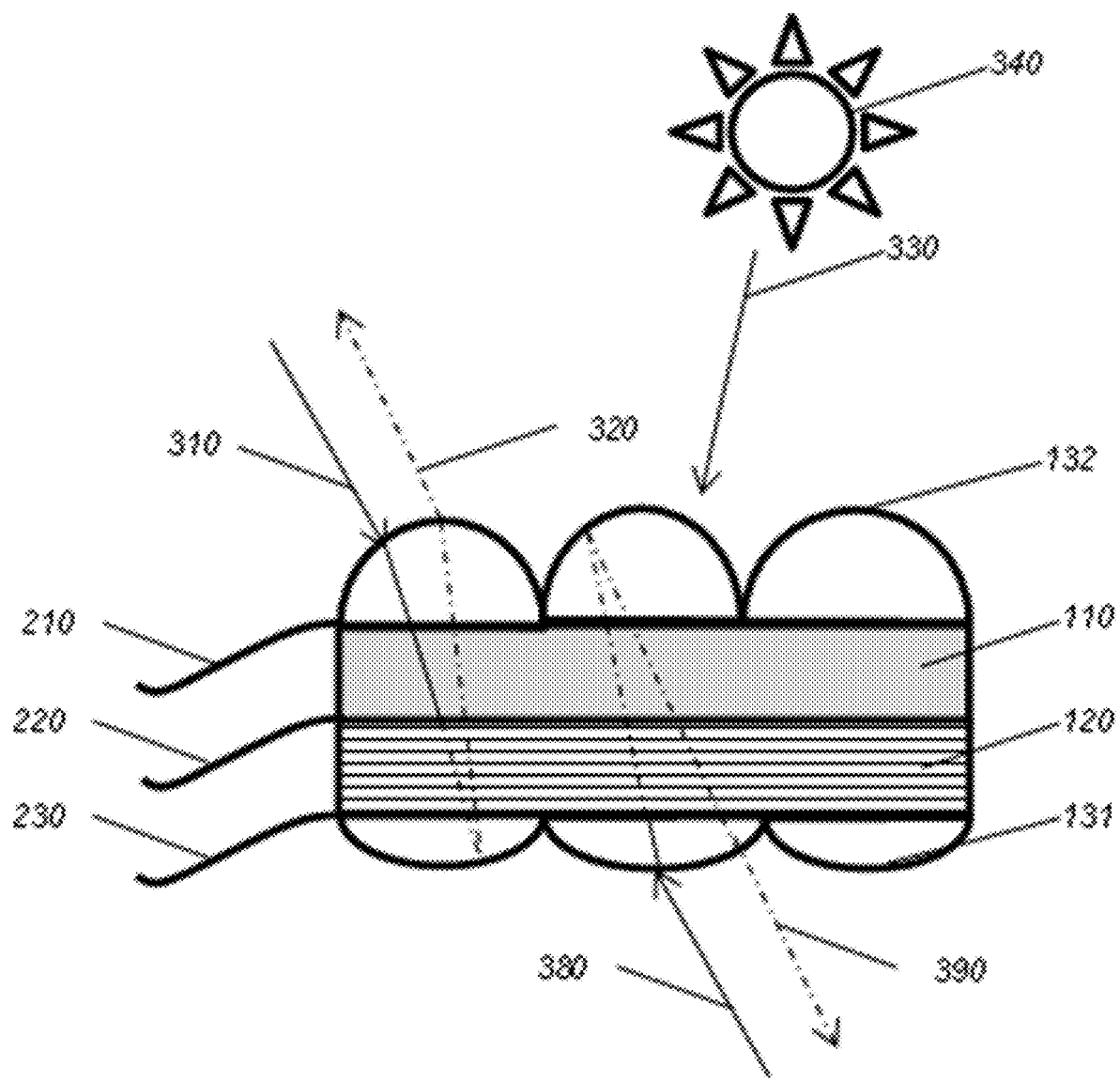
FIG. 2 illustrates a cross-sectional view of a second embodiment of an integrated optical communication and electrical energy generation device.

FIG. 2 shows another illustrative aspect of the integrated optical communication and electrical energy generation device, comprising two retroreflector elements 131 and 132 with textured surfaces. As described here, a textured surface is a surface that is not smooth, such as the front surface of the retroreflector element 132 and the back surface of the retroreflector element 131 with convex and/or concave shapes, lenses and/or mirrors to direct the exiting light 320 back in the direction of the incoming light 310. Back surface of the retroreflector element 131 and/or front surface of the retroreflector element 132 may partially or fully comprise a reflective surface and/or a reflective coating functioning as an optical mirror.

The back surface of the retroreflector element 131 and/or front surface of the retroreflector element 132 may also be shaped such that an incoming light beam 380 towards the rear side of device 100 is reflected within device 100 and exits device 100 at the rear side in a direction 390 parallel to the incoming light beam or at a desired angle relative to the incoming light.

The photovoltaic element 110 of device 100 may absorb and convert ambient light into electricity which impinges onto the front side 132 and/or onto the rear side 131 of device 100.

Figure 3:
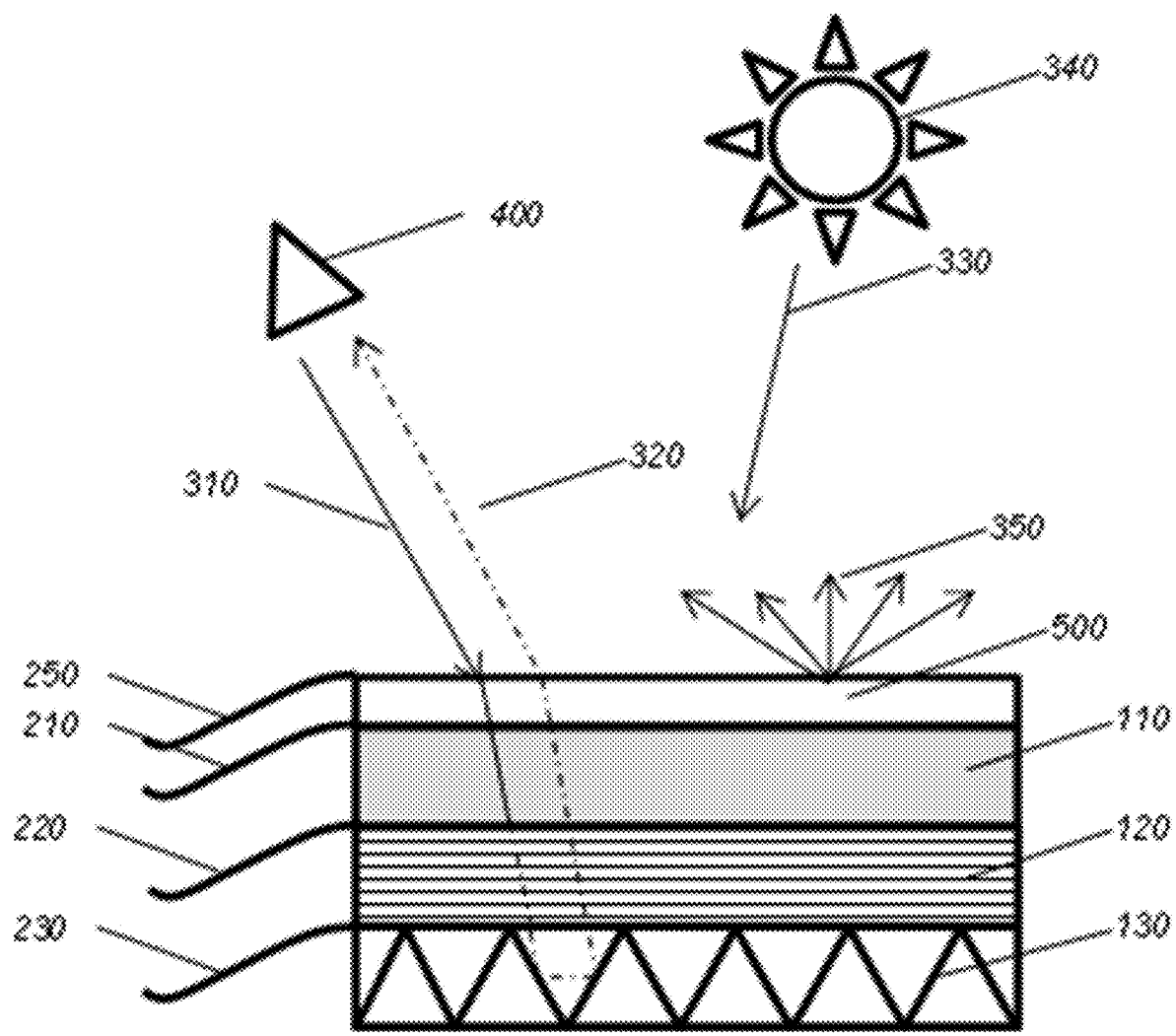
FIG. 3 illustrates a cross-sectional view of a third embodiment of an integrated optical communication and electrical energy generation device.

FIG. 3 shows another illustrative aspect of the integrated optical communication and electrical energy generation device (e.g., used with, on, and/or in a mobile phone), comprising a display 500 or a transparent element with electrical contacts 250. The display or the transparent element 500 may be transparent or semi-transparent for incoming light 310 and exiting light 320. The display 500 may emit light 350 in a multitude of directions.

In some illustrative embodiments, the display 500 may itself be transparent or semitransparent, or alternatively may be permanently transparent to light within a predefined wavelength range. In some embodiments, a transparent OLED may be used, or the display may be made of glass (e.g., a window) or other transparent or semitransparent material. In such an embodiment, ambient light 330 and the photovoltaic element 110 may power the modulator 120. The modulator 120 provides information and/or data in accordance with aspects described herein such that the data would become available inside a room, predefined area, or within a line of sight from the display, for instance where a receiver device 400 can receive the modulated signal 320 using a photodiode. In such an embodiment, the display may remain transparent to the human eye, and infrared wavelengths may be modulated to provide information to a receiving device without significantly altering the transparency and/or legibility of the display and without the display significantly altering and/or absorbing the modulated light 320. If no energy generation is required for device 100, the photovoltaic element 110 may be omitted.

Figure 4:
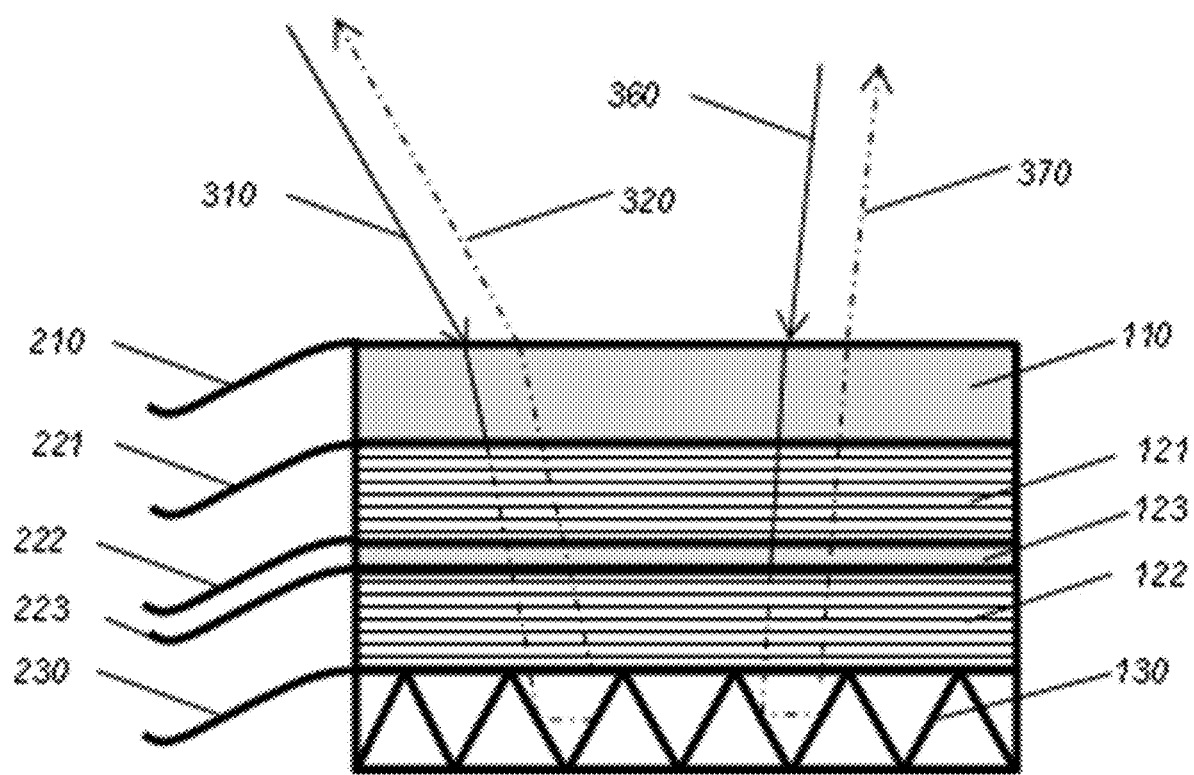
FIG. 4 illustrates a cross-sectional view of a fourth embodiment of an integrated optical communication and electrical energy generation device.

FIG. 4 shows another illustrative aspect of the integrated optical communication and electrical energy generation device, comprising a first optical modulator 121 and a second optical modulator 122. The first optical modulator 121 may modulate incoming light 310 within a defined wavelength range. The second optical modulator 122 may modulate incoming light 360 within a defined wavelength range that may be different from the wavelength range of the first optical modulator 121. This allows simultaneous and independent data modulation for different light sources and receivers as indicated by incoming light beams 310, 360 and exiting light beams 320, 370, respectively.

At the interface between the optical modulator 121 and optical modulator 122, an electrically isolating layer 123 may be located to allow for electrical isolation and independent operation of both optical modulators. An electrical signal may be applied to the first optical modulator 121 via electrical contacts 222 and 211/210. An electrical signal may be applied to the second optical modulator 122 via electrical contacts 230 and 233. For the synchronous operation of both optical modulators 121 and 122, the electrically insulating layer 123 may be omitted, and an electrical signal may be applied to both modulators via electrical contacts 230 and 211/210. In another embodiment, the layer 123 may alter the polarization of the incoming and/or modulated light. In another embodiment, device 100 may contain one, two, or more optical modulators. The electrically insulating layer 123 may be a low doped semiconductor layer, a low doped semiconductor wafer, or an otherwise suited optically transparent material such as glass or similar, or a combination thereof.

Figure 5:
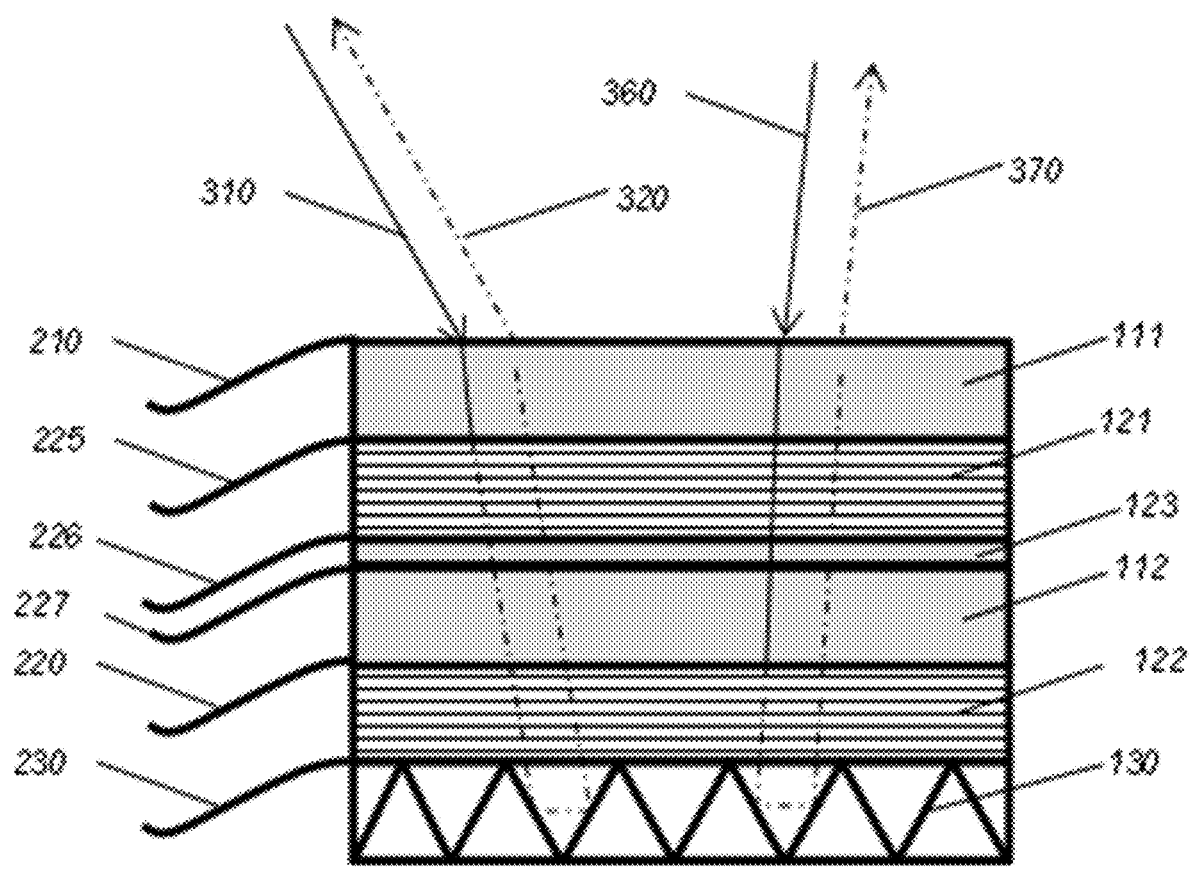
FIG. 5 illustrates a cross-sectional view of a fifth embodiment of an integrated optical communication and electrical energy generation device capable of dual wavelength data communication.

FIG. 5 shows another illustrative aspect of the integrated optical communication and electrical energy generation device, comprising a first photovoltaic device 111, a first optical modulator 121, a second photovoltaic device 112, and a second optical modulator 122. The second optical modulator 122 may modulate incoming light 360 within a defined wavelength range that may be different from the wavelength range of the first optical modulator 121. The first optical modulator 121 may be designed for light modulation within a wavelength range of approximately 900 nm or less to 1100 nm or more. The second optical modulator 122 may be designed for light modulation within a wavelength range of approximately 1400 nm or less to 1600 nm or more. This allows simultaneous and independent data modulation for different light sources and receivers as indicated by incoming light beams 310, 320 and exiting light beams 360, 370, respectively. The second photovoltaic element 112 may have a lower bandgap energy than the first photovoltaic element 111 and may convert light within a defined wavelength range into electricity and/or may operate as an optical detector, such as a photodiode, whereas the first photovoltaic may also function as an optical filter for light with wavelengths lower than its respective bandgap energy. In some embodiments, more than two, and even six or more photovoltaic elements may be grown or stacked on top of each other, each with a different bandgap. In some embodiments, more than two optical modulators may be grown or stacked on top of each other. In some embodiments, the optical modulators may alter the light polarization.

Figure 6:
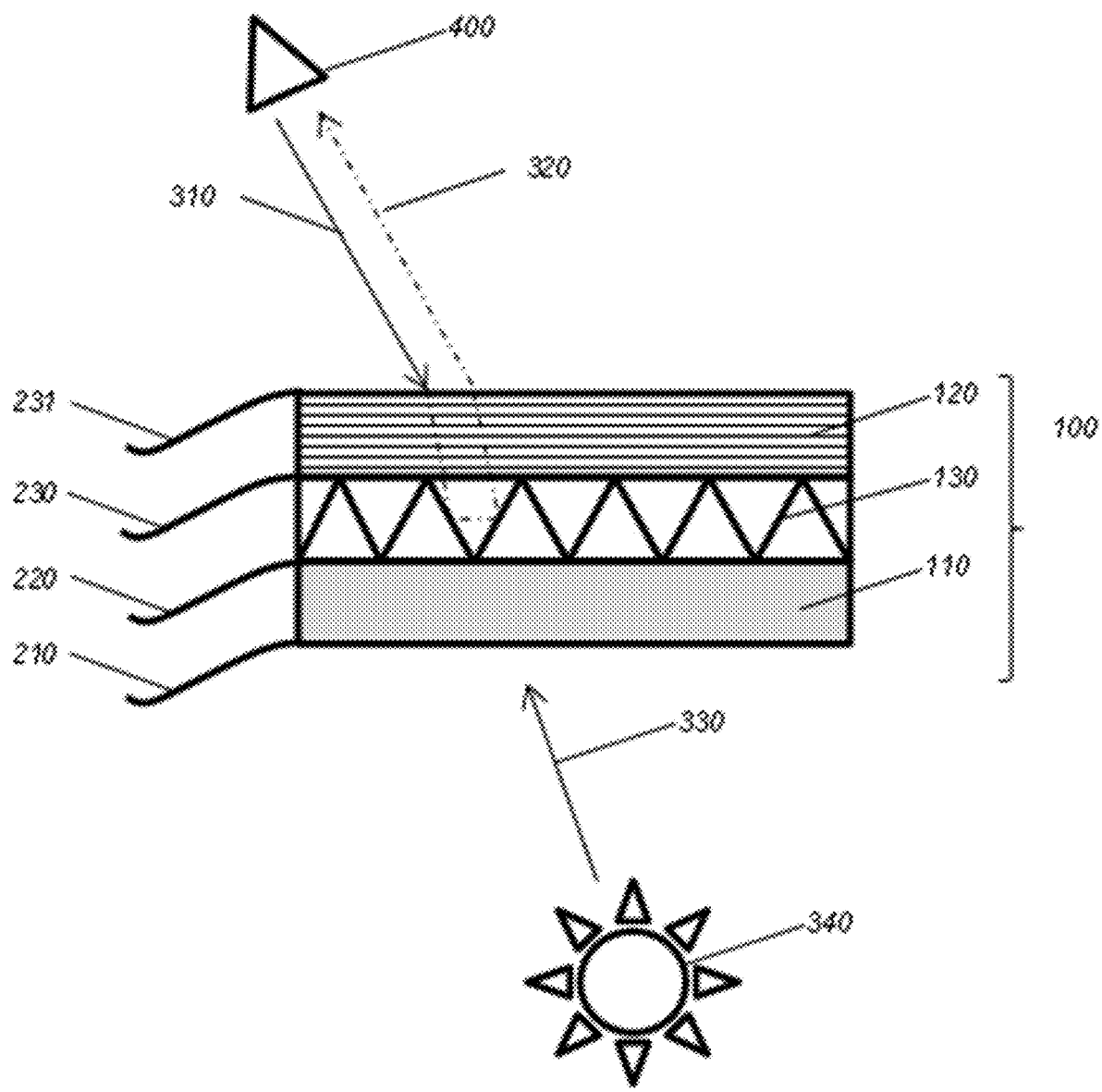
FIG. 6 illustrates a cross-sectional view of a sixth embodiment of an integrated optical communication and electrical energy generation device.

FIG. 6 shows another illustrative aspect and method of the integrated optical communication and electrical energy generation device 100 in which the optically relevant elements and/or electrically relevant elements, such as electrical contacts, may be stacked or arranged within device 100 such that an incoming and interrogating light beam 310 may be modulated and reflected back in direction 320 with said light beams reaching and exiting device 100 on its front side and such that ambient light 330 may be converted to electrical energy by the photovoltaic element when reaching the device 100 on its rear side. Additional layers, such as glass, a semiconductor wafer, Kapton, Mylar, a polymer layer, a similarly suited layer, or a combination of said layers may be incorporated into device 100 for purposes of electrical insulation, mechanical stability, handling, electrical conduction, electrical contacts, or similar.

Figure 7:
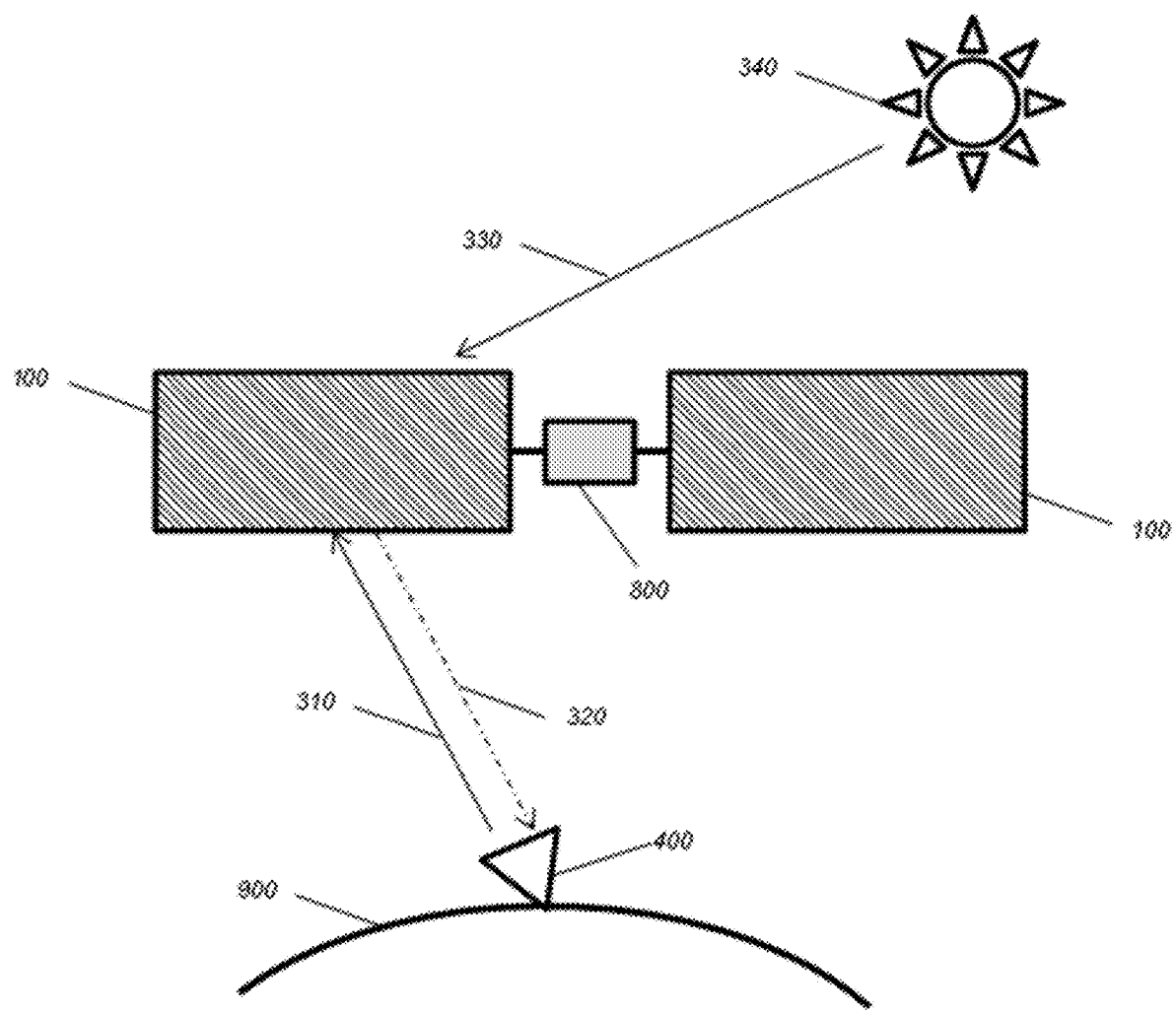
FIG. 7 illustrates a method for using the integrated optical communication and electrical energy generation device for data retrieval from a satellite to a ground station.

FIG. 7 shows another illustrative aspect and method of the integrated optical communication and electrical energy generation device for usage as an optical communication and electrical energy generation device on a satellite. The satellite 800 is shown with two arrays which may be fully or partly comprised of the integrated optical communication and electrical energy generation device 100 or arrays of the integrated optical communication and electrical energy generation devices. Electrical energy can be generated by light to electricity conversion of the photovoltaic element inside the integrated optical communication and electrical energy generation device 100. A source for incoming light 330 for light to electricity conversion may be the sun 340. A transmitter and receiver unit 400 may be located on the surface of the Earth 900 or may also be located on another satellite. The transmitter and receiver unit 400 may use a laser beam 310 directed towards the satellite 800 and receive modulated light 320 which contains information/data of the satellite 800. Aspects described herein overcome current system integration limitations since both the photovoltaic element and the free space optical communication system are combined in one device. Further, the large surface area typically used for photovoltaic arrays can now be used by the integrated optical communication and electrical energy generation device as a large area optical communication interface. The energy-intensive part of sending a laser beam to the satellite relies solely upon the ground station 400 and saves energy on the satellite platform 800.

Figure 8:
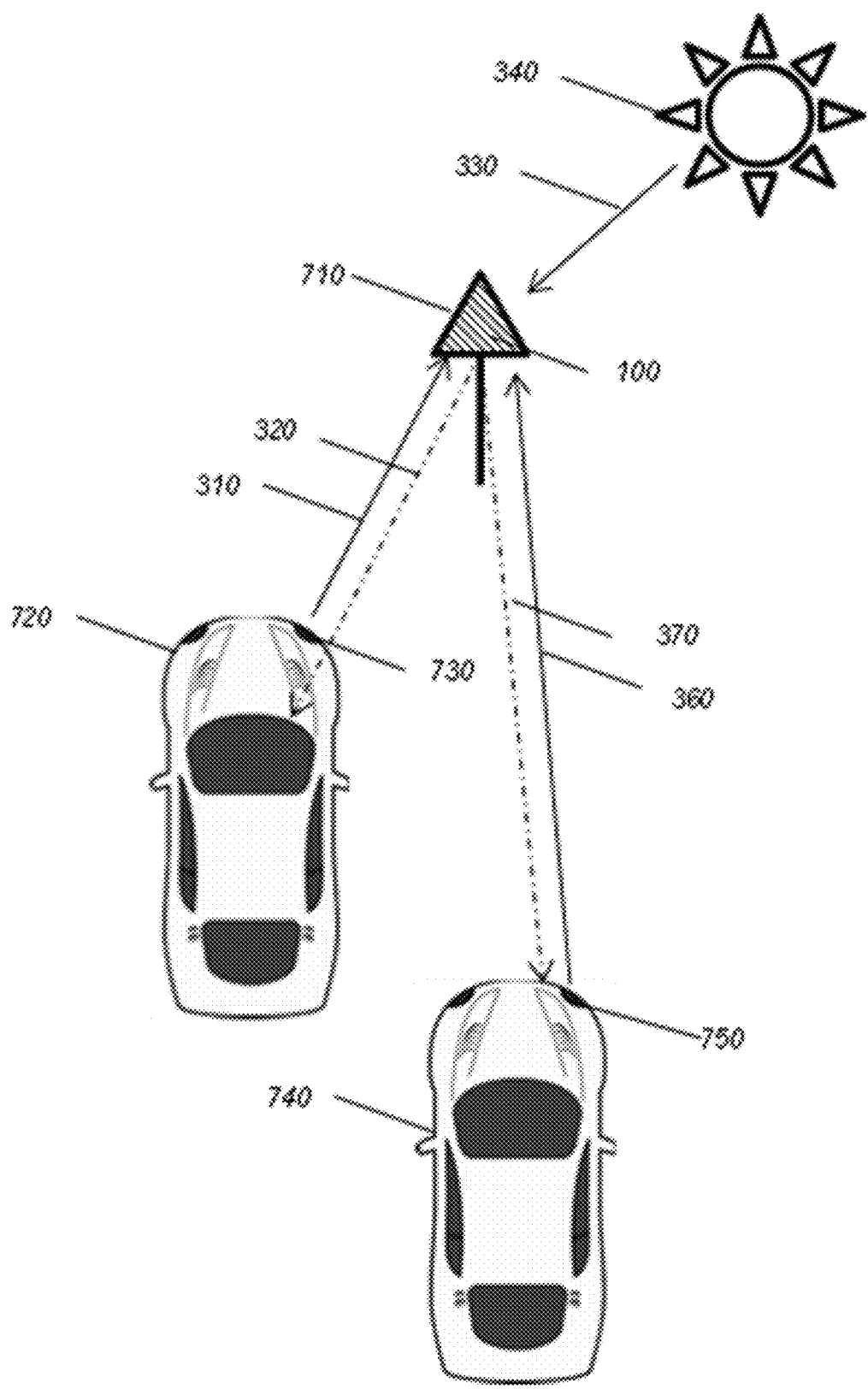
FIG. 8 illustrates a method for using the integrated optical communication and electrical energy generation device for road safety applications, vehicle communication applications, and determination of vehicle location and speed.

FIG. 8 shows another illustrative aspect and method of the integrated optical communication and electrical energy generation device for usage in road safety and vehicle guidance and communication systems. The integrated optical communication and electrical energy generation device 100 may be integrated into a road sign 710. A lamp 730 of a vehicle 720, including but not limited to an incandescent bulb, an LED, a laser or a combination thereof, may be directed towards the road sign 710, indicated by light beam 310. Information/data contained within the road sign 710, including but not limited to location, outside temperature, traffic information, or similar can be sent to a receiver contained in the vehicle 720 via a modulated light beam 320. Further, the reflective nature of road sign 710 allows for measurement of the time-of-flight between vehicle 720 and road sign 710 to determine the distance and velocity of vehicle 720. Since the road sign 710 reflects the light back in the same direction of the incoming light, one or more vehicles 740 can simultaneously receive information/data from the road sign 710, as indicated by light beams 360 and 370 and lamp 750. The integrated photovoltaic element allows for self-powered operation of the road sign. Light beams 310 and 360 may already contain modulated data which may be recorded by the road sign for re-transmission to other vehicles.

Figure 9:
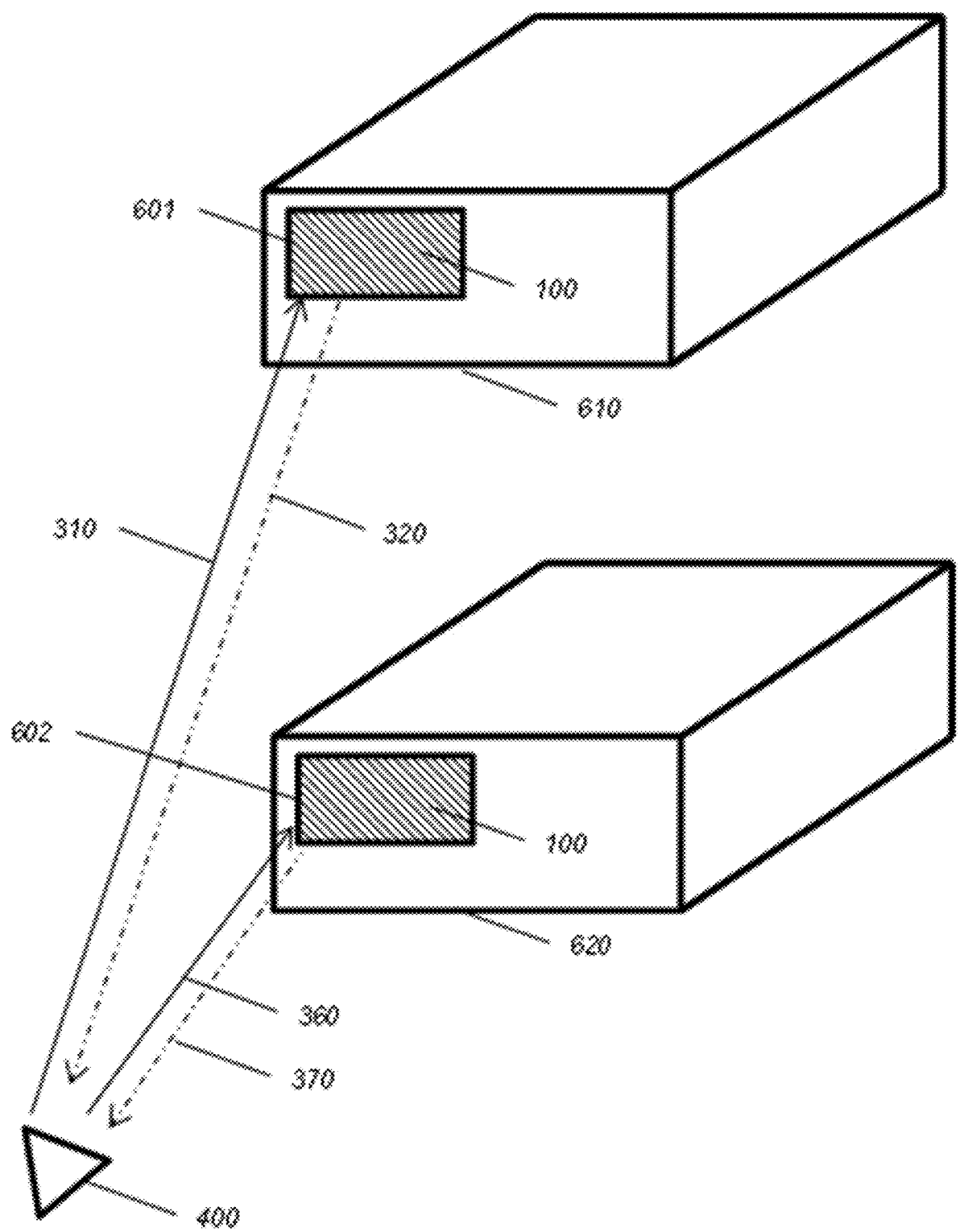
FIG. 9 illustrates a method for using the integrated optical communication and electrical energy generation device for parcel tracking, collection of parcel information/data, and determination of parcel distance and parcel location.

FIG. 9 shows another illustrative aspect and method of the integrated optical communication and electrical energy generation device 100 for usage in transport, logistics, and inventory systems. Parcels 610 and 620 may be stored in a warehouse at different locations. A transmitter and receiver unit 400 may use a directed light beam 310 and 360, including but not limited to a laser beam, to direct light towards a tag 601 and 602 which are attached to the parcel 610 and 620 and which contain said device 100 to obtain information/data on the properties of the parcel via a modulated and reflected light beam 320 and 370 containing these information/data. Further, through the time of flight measurements, the distance between the transmitter and receiver unit and one or a multitude of parcels 610 and 620 can be measured. In addition, since a directed and narrow light beam 310 and 360 is used, the angular orientation of the parcel 610 and 620 and their attached tags 601 and 602 with respect to the transmitter and receiver unit 400 may be obtained via a measurement of the orientation of the light source located within the transmitter and receiver unit 400. The combination of the measurement of the time-of-flight, i.e., distance, and angular orientation allows the determination of the location of the parcel within 3-dimensional space. The reflected and modulated light beam may contain information on the properties of the parcel or otherwise relevant information.

Figure 10:
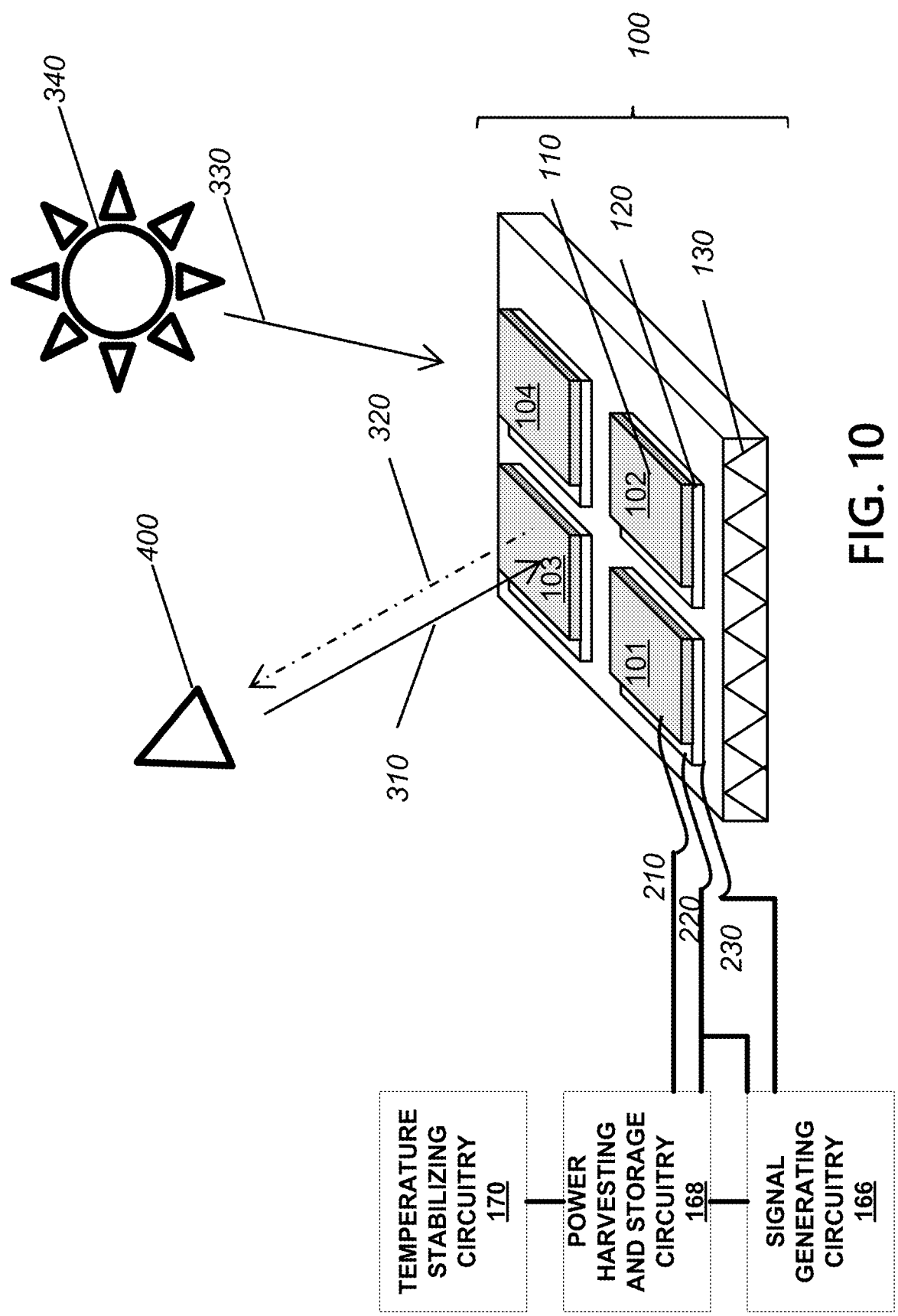
FIG. 10 illustrates a schematic view of a first embodiment of an integrated optical communication and electrical energy generation device with arrays of sub-devices.

FIG. 10 shows another illustrative aspect of the integrated optical communication and electrical energy generation device 100 with smaller sub-devices, such as the sub-devices 101, 102, 103, 104. The sub-devices may be arranged in a mosaic or array pattern. The sub-devices may share a common retroreflector element 130 and have its individual photovoltaic element 110 and electrically controlled light modulator element 120. In some embodiments, the arrays of sub-devices may share common electrical contacts, such as the electrical contacts 210, 220, and 230. In some embodiments, rows or columns of sub-devices in the array may share common electrical contacts. In other embodiments, each sub-device may have its own electrical contacts 210, 220, and 230.

The photovoltaic element 110 of each sub-device may absorb incoming light 330, such as light from the sun 340, ambient room light or otherwise suited light sources and convert the incoming light to electrical energy which can be made available to an external circuit through electrical contacts 210 and 220 and stored in the power harvesting and storage circuitry 168. The optical modulator 120 of each sub-device may change its transparency for a light of a certain wavelength range as a function of an electrical signal which can be applied through electrical contacts 220 and 230. The common retroreflector element 130 reflects the modulated light 315 back in the direction 320 substantially parallel to the direction of the incoming light 310.

The electrically controlled light modulator element 120 may change its transparency for a light of a certain wavelength range as a function of an electrical signal which can be applied through electrical contacts 220 and 230 by the signal generating circuitry 166. The signal generating circuitry 166 can be powered by the power harvesting and storage circuitry 168.

The temperature of device 100 may also be stabilized by a heater or a cooler which may be controlled and powered fully or in part by electrical energy generated by the photovoltaic element 110 and stored in the power harvesting and storage circuitry 168.

Figure 11:
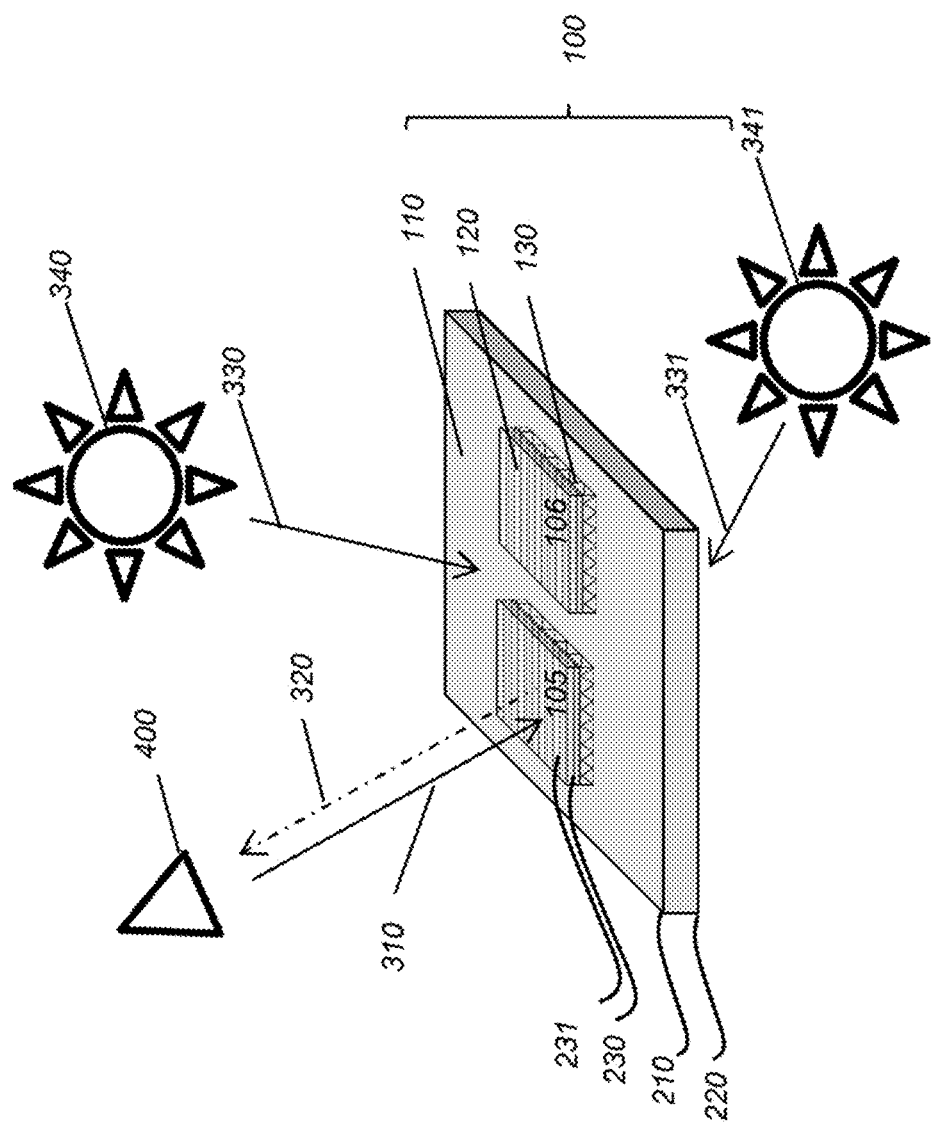
FIG. 11 illustrates a schematic view of a second embodiment of an integrated optical communication and electrical energy generation device with arrays of sub-devices.

FIG. 11 shows another illustrative aspect of the integrated optical communication and electrical energy generation device 100 with smaller sub-devices, such as the sub-devices 105 and 106. The sub-devices may be arranged in a mosaic or array pattern. The sub-devices may share a common photovoltaic element 110 and have its individual electrically controlled light modulator element 120 and retroreflector element 130. In some embodiments, the arrays of sub-devices may share common electrical contacts, such as the electrical contacts 210, 220, 230, and 231. In some embodiments, rows or columns of sub-devices in the array may share common electrical contacts. In other embodiments, each sub-device may have its own electrical contacts 230 and 231 with common electrical contacts 210 and 220 for the photovoltaic element 110.

The photovoltaic element 110 of each sub-device may absorb incoming light 330, 331 331, such as light from the sun 340, ambient room light or otherwise suited light sources and convert the incoming light to electrical energy which can be made available to an external circuit through electrical contacts 210 and 220 and stored in the power harvesting and storage circuitry 168. The optical modulator 120 of each sub-device may change its transparency for a light of a certain wavelength range as a function of an electrical signal which can be applied through electrical contacts 230 and 231. The retroreflector element 130 reflects the modulated light back in the direction 320 substantially parallel to the direction of the incoming light 310.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only and is not limiting.

The invention claimed is:

1. An integrated device comprising:
   at least one photovoltaic element, wherein the at least one photovoltaic element is adapted to receive a light beam and generate power from a first portion of the received light beam that is within a first wavelength range, and wherein the at least one photovoltaic element comprises one of the following: GaAs, InP, InGaAs, GaInP, or AlGaAs;
   at least one light modulating element disposed on the at least one photovoltaic element, wherein the at least one light modulating element modulates, based on one or more input signals received from a signal generating circuitry, a second portion of the received light beam that is within a second wavelength range, wherein wavelengths in the first wavelength range are smaller than wavelengths in the second wavelength range, and wherein the at least one light modulating element comprises at least one of the following: InGaAs, InGaAsP, InP, InAsP, AlGaAs, InAlGaAs, or GaAsP; and at least one light reflecting element disposed on the at least one light modulating element, wherein the at least one light reflecting element is adapted to reflect the modulated second portion of the light beam such that the modulated second portion of the light beam exits the integrated device in a direction substantially parallel to the received light beam.

2. The integrated device of claim 1, further comprising:
one or more first conductors coupled to the at least one photovoltaic element; and
a power harvesting and storage circuitry adapted to harvest and generate the power generated by the at least one photovoltaic element, wherein the power harvesting and storage circuitry is connected to the at least one photovoltaic element by the one or more first conductors.

3. The integrated device of claim 2, further comprising:
one or more second conductors coupled to the at least light modulating element; and
the signal generating circuitry adapted to generate the one or more input signals for the at least one light modulating element, and send the one or more input signals through the one or more second conductors.

4. The integrated device of claim 3, wherein the signal generating circuitry is at least partially powered by the power harvesting and storage circuitry.

5. The integrated device of claim 2, further comprising a temperature stabilizing circuitry, wherein the temperature stabilizing circuitry is adapted to maintain an operating temperature of the integrated device and is at least partially powered by the power harvesting and storage circuitry.

6. The integrated device of claim 1, further comprising a display disposed adjacent to the at least one photovoltaic element.

7. The integrated device of claim 1, wherein one or more doped semiconducting layers are disposed between the at least one light modulator element and the at least one photovoltaic element.

8. The integrated device of claim 1, wherein one or more doped semiconducting layers are disposed between the at least one light modulator element and the at least one light reflecting element.

9. The integrated device of claim 1, further comprising:
a plurality of light modulating elements separated by at least one electrically isolating layer and disposed between the at least one photovoltaic element and the at least one light reflecting element,
wherein each light modulating element of the plurality of light modulating elements is adapted to modulate the second portion of the received light beam within a light wavelength range that is within the second wavelength range and specific to said light modulating element.

10. The integrated device of claim 9, further comprising a plurality of photovoltaic elements,
wherein light modulating elements in the plurality of light modulating elements are separated by the plurality of photovoltaic elements, and
wherein each photovoltaic element of the plurality of photovoltaic elements has an energy bandgap specific to said photovoltaic element.

11. The integrated device of claim 9, wherein the at least one electrically isolating layer is adapted to modify a polarization of the second portion of the received light beam.

12. An integrated device comprising:
at least one light modulating element, wherein the at least one light modulating element comprises at least one of the following: InGaAs, InGaAsP, InP, InAsP, AlGaAs, InAlGaAs, or GaAsP, and wherein the at least one light modulating element is adapted to:
receive, from a signal generating circuitry, one or more input signals; and
modulate, based on the one or more input signals, a first light beam from a first direction, and within a first wavelength range;
at least one light reflecting element disposed on the at least one light modulating element, wherein the at least one light reflecting element is adapted to reflect the modulated first light beam such that the modulated first light beam exits the integrated device in a second direction substantially parallel to the first direction; and
at least one photovoltaic element disposed on the at least one light reflecting element, wherein the at least one photovoltaic element comprises one of the following: GaAs, InP, InGaAs, GaInP, or AlGaAs, wherein the at least one photovoltaic element is adapted to receive a second light beam from a third direction and generate power from the second light beam, wherein the second light beam is within a second wavelength range, and wherein wavelengths in the first wavelength range are larger than wavelengths in the second wavelength range.

13. The integrated device of claim 12, further comprising:
one or more first conductors coupled to the at least one photovoltaic element;
a power harvesting and storage circuitry adapted to harvest and store the power generated by the at least one photovoltaic element, wherein the power harvesting and storage circuitry is connected to the at least one photovoltaic element by the one or more first conductors;
one or more second conductors coupled to the at least light modulating element; and
the signal generating circuitry adapted to send the one or more input signals through the one or more second conductors, wherein the signal generating circuitry is at least partially powered by the power harvesting and storage circuitry.

14. The integrated device of claim 1, wherein the at least one light modulating element is further adapted to modify a polarization of the second portion of the received light beam.

15. A method comprising:
receiving, by a photovoltaic element, a light beam;
generating, by the photovoltaic element, power from a first portion of the received light beam that is within a first wavelength range;
receiving, from a signal generating circuitry and for a light modulating element stacked with the photovoltaic element, one or more input signals;
modulating, by the light modulating element and based on the one or more input signals, a second portion of the received light beam that is within a second wavelength range, wherein wavelengths in the first wavelength range are smaller than wavelengths in the second wavelength range; and
reflecting, by a light reflecting element stacked with the light modulating element and the photovoltaic element, the modulated second portion of the light beam such that the modulated second portion of the light beam exits the integrated device in a direction substantially parallel to the received light beam.

16. The method of claim 15, further comprising:
harvesting, by a power harvesting and storage circuitry, the power generated by the photovoltaic element.

17. The method of claim 16, wherein the signal generating circuitry is at least partially powered by the power harvesting and storage circuitry.

18. The method of claim 16, further comprising:
maintaining, by a temperature stabilizing circuitry at least partially powered by the power harvesting and storage circuitry, an operating temperature.

19. The method of claim 15, wherein a polarization of the second portion of the received light beam is modified by at least one of: a light modulating element, an electrically insulating layer, or a light reflecting element.

20. The method of claim 15, wherein the light modulating element comprises at least one of the following: InGaAs, InGaAsP, InP, InAsP, AlGaAs, InAlGaAs, or GaAsP; and
wherein the photovoltaic element comprises one of the following: GaAs, InP, InGaAs, GaInP, or AlGaAs.

\* \* \* \* \*